(12) United States Patent
Bertram

(10) Patent No.: US 8,634,784 B2
(45) Date of Patent: Jan. 21, 2014

(54) COMPACT RADIOFREQUENCY COUPLER

(75) Inventor: Pierre Bertram, Jallais (FR)

(73) Assignee: Thales, Neuilly sur Seine (FR)

( * ) Notice: Subject to any disclaimer, the term of this patent is extended or adjusted under 35 U.S.C. 154(b) by 135 days.

(21) Appl. No.: 13/131,018

(22) PCT Filed: Oct. 8, 2009

(86) PCT No.: PCT/EP2009/063077
§ 371 (c)(1),
(2), (4) Date: Sep. 16, 2011

(87) PCT Pub. No.: WO2010/060675
PCT Pub. Date: Jun. 3, 2010

(65) Prior Publication Data
US 2012/0040631 A1  Feb. 16, 2012

(30) Foreign Application Priority Data

Nov. 25, 2008 (FR) .................................... 08 06618

(51) Int. Cl.
*H04B 17/00* (2006.01)
*H01P 5/12* (2006.01)
*H01F 5/00* (2006.01)
*H03G 3/30* (2006.01)
*H01F 27/28* (2006.01)
*H01P 7/08* (2006.01)

(52) U.S. Cl.
CPC ...... *H03G 3/3042* (2013.01); *H01F 2027/2819* (2013.01); *H01P 7/08* (2013.01)
USPC ........ 455/115.1; 455/126; 333/109; 333/119; 333/131; 336/200; 336/232

(58) Field of Classification Search
USPC ............... 455/115.1, 126; 333/109, 112, 119, 333/131; 336/200, 220, 232
See application file for complete search history.

(56) References Cited

U.S. PATENT DOCUMENTS

| 4,817,189 | A | * | 3/1989 | Pfizenmaier et al. | 375/258 |
| 5,353,001 | A | * | 10/1994 | Meinel et al. | 336/83 |
| 5,557,245 | A | * | 9/1996 | Taketa et al. | 333/116 |
| 6,114,924 | A | * | 9/2000 | Cain et al. | 333/112 |
| 8,203,418 | B2 | * | 6/2012 | Harrison et al. | 336/200 |
| 8,249,544 | B2 | * | 8/2012 | Okabe | 455/338 |
| 8,354,894 | B2 | * | 1/2013 | Mui | 333/131 |
| 2002/0175780 | A1 | * | 11/2002 | Setty et al. | 333/119 |
| 2004/0207482 | A1 | | 10/2004 | McAndrew et al. | |
| 2005/0077993 | A1 | | 4/2005 | Kanno et al. | |
| 2009/0195344 | A1 | * | 8/2009 | Marvel et al. | 336/200 |

* cited by examiner

Primary Examiner — Duc M Nguyen
(74) Attorney, Agent, or Firm — Baker & Hostetler LLP

(57) ABSTRACT

A compact and low-cost radiofrequency coupler, notably for the production of radiofrequency transmitters, includes a transmission line and a measuring line, the measuring line being coupled to the transmission line by the intermediary of windings, the transmission line, the measuring line and the windings being printed on a printed circuit board, upon which is fixed, by a clip-on technique, a binocular ferrite core that is essentially planar and E-shaped and whose central branch is disposed between the transmission line and the measuring line and whose distal branches are disposed in the central region of the planar windings.

7 Claims, 3 Drawing Sheets

COMPACT RADIOFREQUENCY COUPLER

CROSS-REFERENCE TO RELATED APPLICATIONS

This application is a National Stage of International patent application PCT/EP2009/063077, filed on Oct. 8, 2009, which claims priority to foreign French patent application No. FR 0806618, filed on Nov. 25, 2008, the disclosures of which are incorporated by reference in their entirety.

FIELD OF THE INVENTION

The present invention relates to a compact radiofrequency coupler. It is notably applied for the production of radiofrequency transmitters at low cost.

BACKGROUND

Power couplers, notably bidirectional ones, used in radiofrequency transmitters make it possible to check the transmitted power by sampling a fraction of the signal. For this purpose, they are for example disposed at the output of a power amplifier. Bidirectional couplers make it possible to check both the incident input power and the power reflected by a load, for example an antenna. Bidirectional power couplers commonly have the function of coupling a secondary line— or measuring line—to the transmission line by the intermediary of transformers.

Bidirectional power couplers are therefore notably found at the output of RF or microwave frequency amplifiers, for example on amplification boards equipping radio transmitters and HF terminals, with operating frequencies of the order of one MHz to several tens of MHz, or in radar transmitters operating in much higher frequency ranges.

The use of such couplers makes it possible to check the correct functioning of amplifiers by diagnosing the presence or absence of output power, or even to determine a standing wave ratio, or S.W.R., by measuring the reflected power. Such information makes it possible to trigger possible alarms in the case of malfunction, or even to carry out a control of the operating parameters of the load.

Bidirectional power couplers have been proposed, using transformers formed by wire windings on cores of ferromagnetic material. Notably, a bidirectional power coupler has been proposed comprising a ferrite core with two cylindrical cavities, or binocular ferrite core, each of these cavities being wound with a wire winding, the winding thus extending over the inside surface of the cavities and the outside surface of the ferrite core. The American patent published under the reference U.S. Pat. No. 6,114,924 proposes an alternative construction of such a coupler, having two binocular ferrite cores placed back-to-back, allowing the winding to extend essentially over the inside surface of the cavities.

However, such coupler structures are produced by skilled small-scale production, which essentially has an effect on their manufacturing cost and possibly on the reproducibility and quality of performance, notably in terms of losses and coupling directivity. Moreover, this production imposes the manual application and soldering of the coupler onto the board it equips.

SUMMARY OF THE INVENTION

A purpose of the invention is to overcome the abovementioned disadvantages by proposing a bidirectional power coupler that can be produced on an industrial scale, at low cost, and being easy to integrate. For this purpose, the invention relates to a bidirectional coupler comprising a main transmission line and a measuring line coupled to the transmission line by means of two windings wound around a ferrite core, characterized in that said windings are of planar structure and are produced in a printed circuit board.

According to one embodiment of the invention, the main transmission line, the measuring line and the windings are produced by a technique of the multilayer microstrip type.

According to an embodiment of the invention, the windings surround a single binocular ferrite core of planar structure.

According to an embodiment of the invention, the binocular ferrite core is disposed on the surface of the printed circuit board and is E-shaped, the central branch of the E being disposed between the main transmission line and the measuring line, the distal branches of the E being disposed in the central region of the planar windings.

According to an embodiment of the invention, the binocular ferrite core is fixed to the printed circuit board by means of a support and a clip-on fixing part.

According to an embodiment of the invention, the binocular ferrite core is fixed on the printed circuit board by bonding.

The invention also relates to a radiofrequency transmitter comprising a radiofrequency coupler such as described above.

BRIEF DESCRIPTION OF THE DRAWINGS

Other features and advantages of the invention will become apparent on reading the following description, given by way of example with reference to the appended drawings in which.

DETAILED DESCRIPTION

Figure 1:
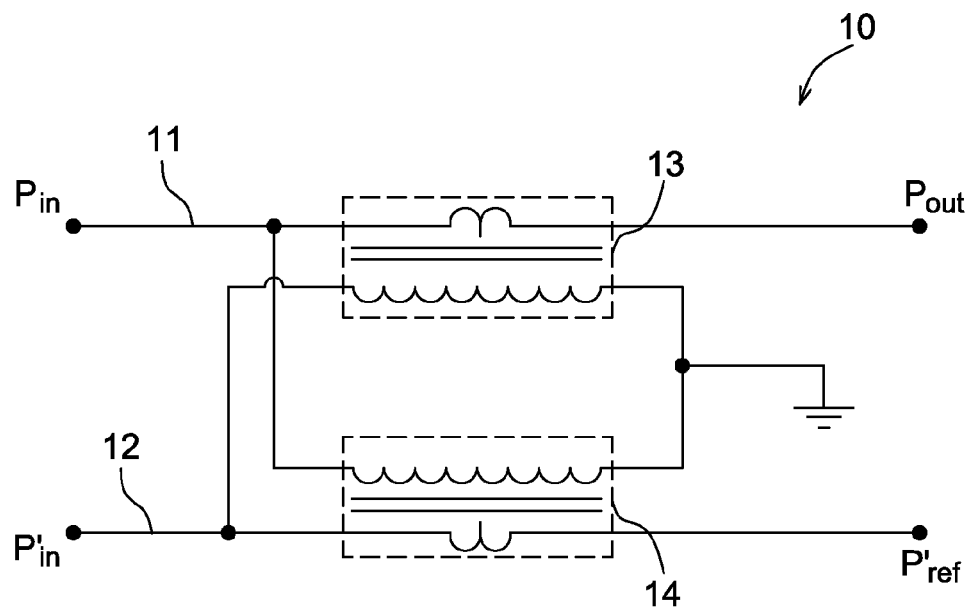
FIG. 1 shows the electrical circuit diagram of an example of a coupler according to the invention.

FIG. 1 shows the electrical circuit diagram of a bidirectional microwave frequency coupler 10, known to those skilled in the art. The coupler has a main transmission line 11, a measuring line 12, the measuring line 12 being coupled to the transmission line 11 by the intermediary of two transformers 13 and 14 whose functions are to sample the current and the voltage, these two transformers being interconnected in order to ensure the symmetry of the circuit. The coupler has an input Pin, for example connected to the output line of an amplifier, an output Pout, connected to a load, an output P'in and an output P'ref, connected to measuring means. The incident power (for example the output power of the amplifier) enters the coupler at Pin, a portion of the incident power is sampled and directed towards the coupled output P'in, the remaining major portion of the incident power being directed, via the transmission line 11, to the output Pout. The power reflected by the load enters Pout and is directed to the isolated output P'ref. The measurement of the power at Pin thus allows an estimation of the incident power without having significantly changed the power of the signal transmitted between the input Pin and the output Pout. Similarly, a measurement of the power at P'ref allows an estimation of the power reflected at the load.

Figure 2:
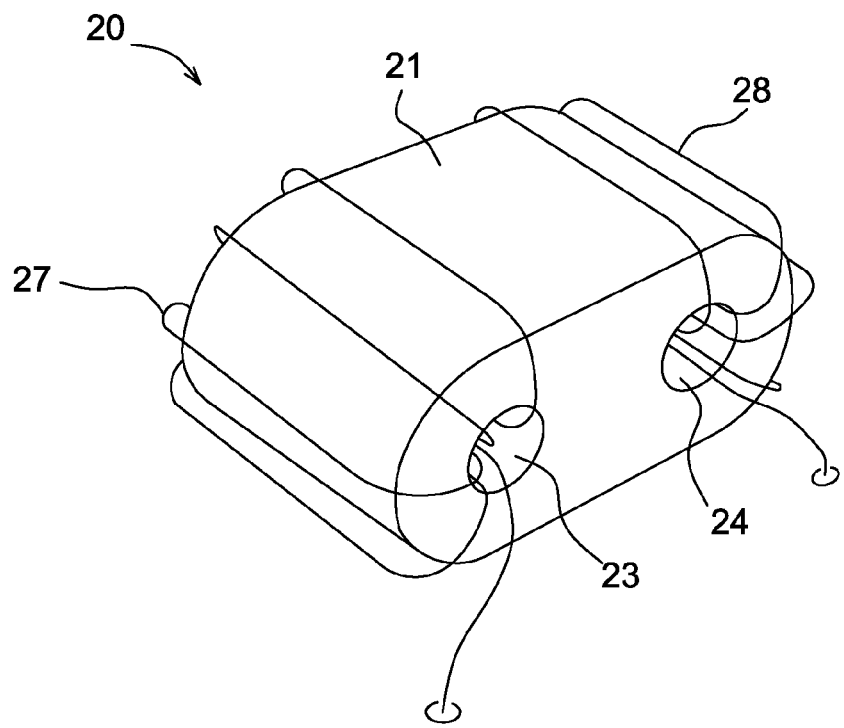
FIGS. 2 and 3 show examples of microwave frequency coupler structures known in the prior art.

FIG. 2 shows a coupler structure 20 known in the prior art, whose representative circuit diagram is shown in FIG. 1. In this coupler structure, wire windings 27 and 28 are produced around a single ferrite core 21 having two cylindrical cavities 23 and 24, called a "binocular ferrite core". The coupler can then be applied onto a printed circuit board and the ends of the wires of the windings connected to the appropriate tracks by soldering.

Figure 3:
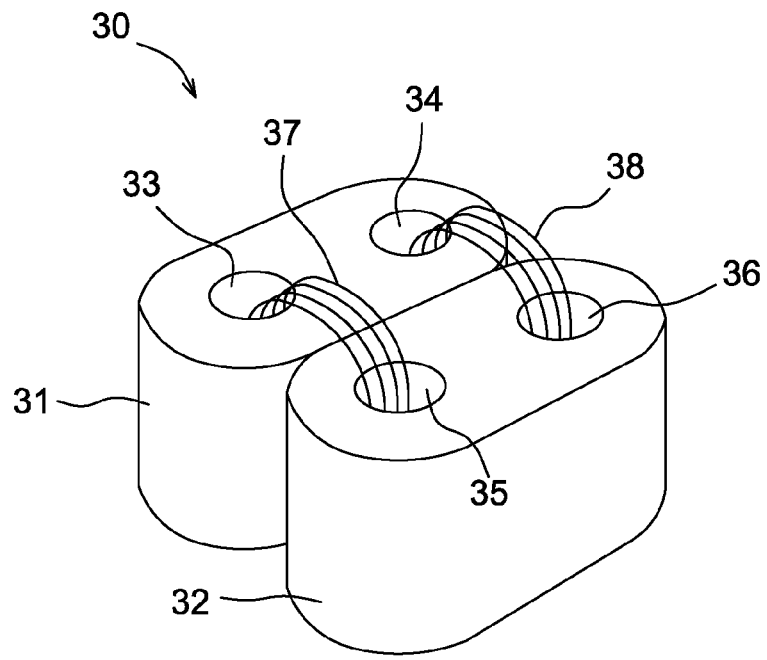

FIG. 3 shows a coupler 30 structure according to the invention described in the abovementioned American patent published under the reference U.S. Pat. No. 6,114,924, bringing an improvement to the structure described by FIG. 2, notably by obtaining a better attenuation in reflection and a better stability of performance over time. In this coupler structure, the wire windings 37 and 38 are produced around two binocular ferrite cores 31 and 32 placed back-to-back in contact with one another. Each winding is produced around the cylindrical cavity of one of the two ferrite cores and the cylindrical cavity of the other ferrite core in alignment with the first cylindrical cavity. For example, the winding 37 is produced by proceeding with a winding starting from the bottom of the cylindrical cavity 33 of the ferrite core 31, penetrating through the top of the cylindrical cavity 35 of the ferrite core 32 and then again through the bottom of the cylindrical cavity 33, etc. in order finally, once the desired number of winding turns is reached, to emerge from the bottom of the cylindrical cavity 35. Similarly, the winding 38 is produced by proceeding with a winding along the generatrices of the cylindrical cavities 34 and 36 of the ferrite cores 31 and 32 respectively.

The coupler structures shown in FIGS. 2 and 3 described above exhibit several disadvantages. Notably, such structures must be produced by skilled small-scale production; the quality of the windings is thus dependant on the operators, impacting the reproducibility of the performance of these couplers. Moreover, the integration of such couplers on printed circuit boards and in HF remote transmission stations is generally a skilled operation, with the production of several solderings. Finally and consequently, the manufacture and installation of such couplers represent a significant cost in comparison with the total cost of the boards which are equipped with them.

Figure 4:
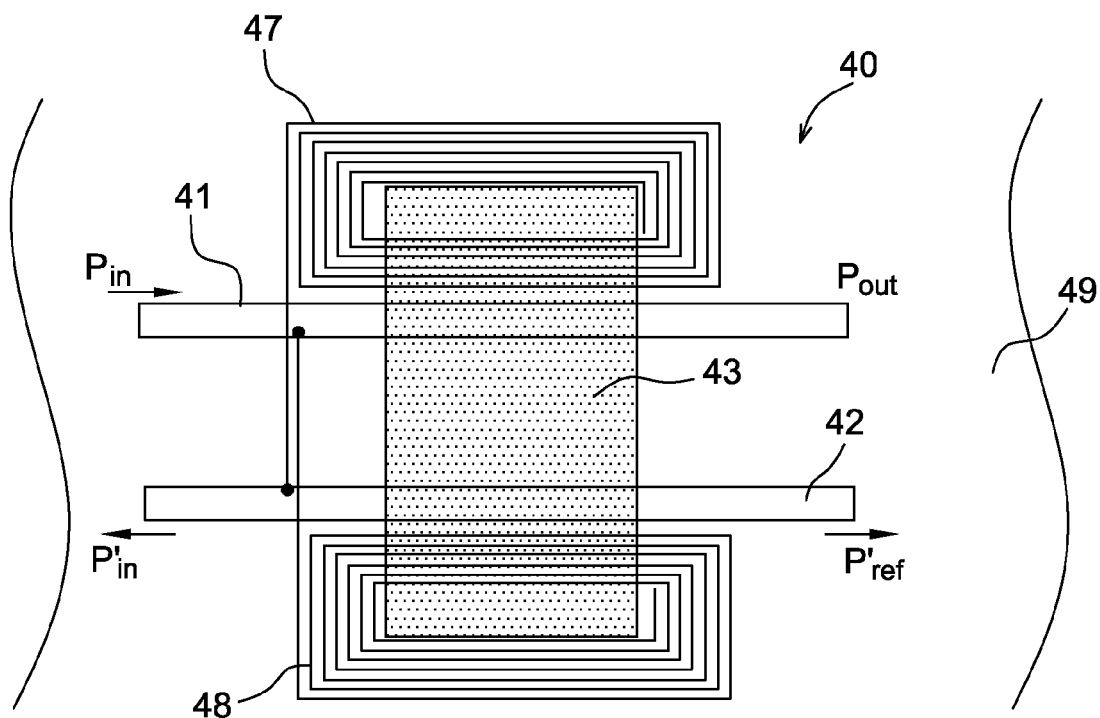
FIG. 4 shows a diagrammatic representation of an example of a coupler according to the invention, in plan view.
Figure 5:
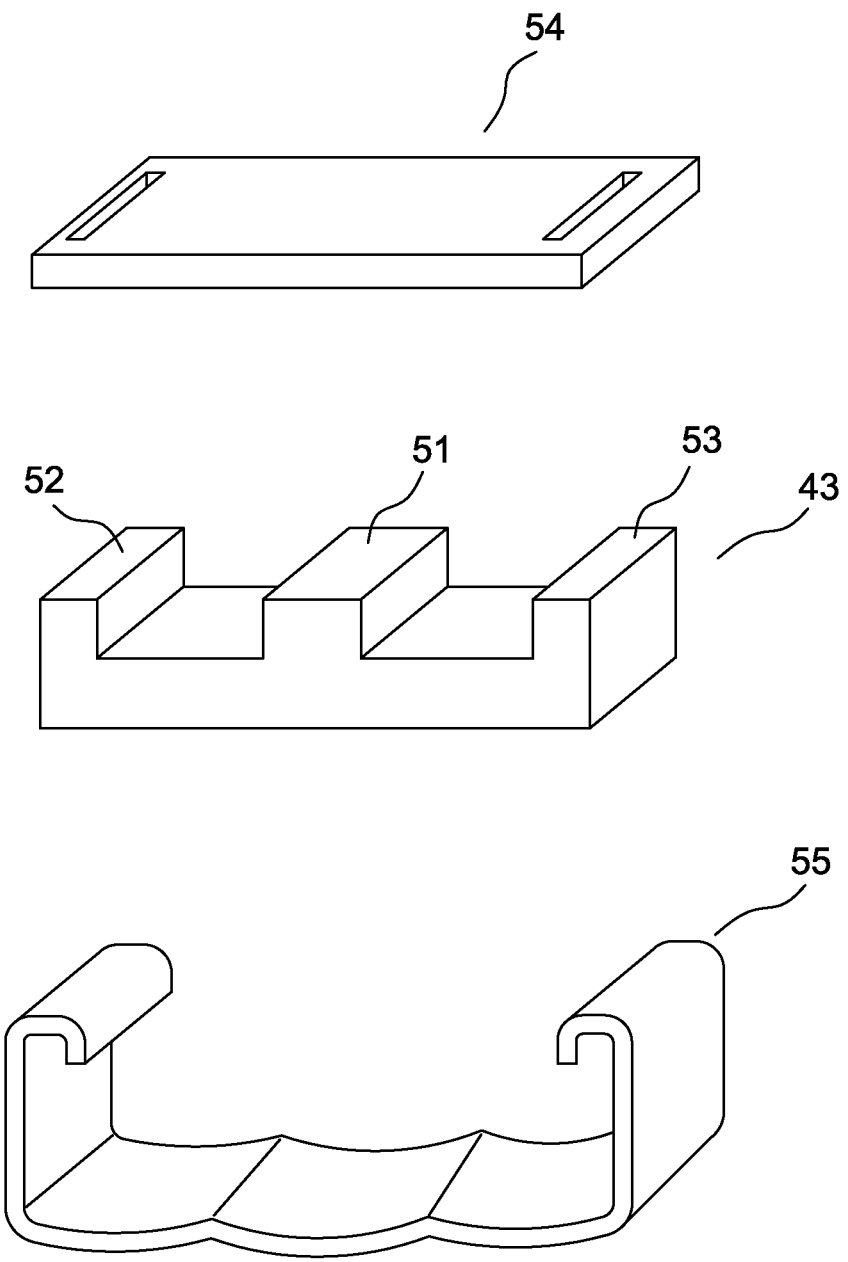
FIG. 5 shows a perspective view of a ferrite core according to an example embodiment of the invention.

FIG. 4 shows a coupler 40 according to the invention. The example of a coupler structure according to the invention overcomes the previously mentioned problems. The windings 47 and 48 are planar windings produced on a printed circuit board 49. The transmission line 41 and the measuring line 42 are produced in the form of printed tracks on the same board. According to an embodiment of the invention, the printed tracks are produced by the so-called "microstrip" technology making it possible to produce multilayer waveguides on substrates of printed circuit boards. According to a preferred embodiment of the invention, the planar windings are produced over several layers and connected by vias, in order to maximize the number of turns whilst keeping to a small area of the printed circuit board. A magnetic coupling between the transmission line 41 and the winding 47 facing it is ensured. In the same way, a magnetic coupling is ensured between the measuring line 42 and the winding 48 facing it. For example, in order to sample a signal on the transmission line which is attenuated by −22 dB, it is possible to produce three-turn windings over four superimposed layers. In order to guide the magnetic field lines whilst minimizing losses, it is necessary to make use of a ferrite core. According to a preferred embodiment of the invention, a binocular ferrite core 43 of essentially planar structure is used. A standard (Commercial Off-The-Shelf) Manganese-Zinc ferrite core intended for transformers or coils for chopped power supplies, operating at frequencies up to 1 MHz and having a magnetic permeability substantially equal to 900 up to these frequencies, can be used. This type of ferrite core has the advantage of being available commercially as a standard item and therefore at low cost. According to a preferred embodiment of the invention, the ferrite core 43 has an E-shaped structure. Thus the central branch 51 of the E is disposed between the transmission line 41 and the measuring line 42, and the distal branches 52 and 53 of the E are disposed in the central region of the planar windings 47 et 48. According to a preferred embodiment of the invention, the three branches of the E 51, 52 and 53 pass through appropriate holes formed in the printed circuit board, thus allowing the fixing of the ferrite core on the printed circuit board using, for example, a support element 54 disposed on the opposite face of the printed circuit board, and a clip-on fixing means 55. According to an alternative embodiment of the invention, the ferrite core can be fixed on the printed circuit board by bonding. It is of course understood that those skilled in the art will be able to envisage any other known fixing technique.

The advantages procured by the bidirectional coupler structure described above are clearly apparent to those skilled in the art, this bidirectional structure dispensing with the application and soldering of components onto the printed circuit board, upon which the transmission line, the measuring line and also the windings, together with their interconnections, are printed, the whole assembly being able to be produced in a small volume and at low cost, with perfect reproducibility and good stability of performance over time. Moreover, the use of a standard and low-cost ferrite core makes it possible to reduce the overall cost of the coupler. For example, such a coupler typically used in an HF transmitter, for powers of the order of from one Watt to several tens of Watts and an operating frequency of between 1 MHz and several tens of MHz, can reasonably be produced on a board area of the order of three square centimeters.

The invention claimed is:

1. A radiofrequency coupler comprising a main transmission line and a measuring line coupled to the transmission line by means of two windings wound around a ferrite core,
    wherein said windings are of planar structure and are produced in a printed circuit board,
    wherein said windings surround a single binocular ferrite core of planar structure, and
    wherein said binocular ferrite core is disposed on the surface of the printed circuit board and is E-shaped, the central branch of the E shape being disposed between the main transmission line and the measuring line, the distal branches of the E shape being disposed in the central region of the planar windings.

2. The radiofrequency coupler as claimed in claim 1, wherein the main transmission line, the measuring line and the windings are produced, by a technique of the multilayer microstrip type.

3. The radiofrequency coupler as claimed in claim 1 wherein said binocular ferrite core is fixed to the printed circuit board by means of a support and a clip-on fixing part.

4. The radiofrequency coupler as claimed in claim 1 wherein said binocular ferrite core is fixed on the printed circuit board by bonding.

5. A radiofrequency transmitter, comprising a radiofrequency coupler as claimed in claim 1.

6. The radiofrequency coupler as claimed in claim 1, wherein said binocular ferrite core is fixed to the printed circuit board by means of a support and a clip-on fixing part.

7. The radiofrequency coupler as claimed in claim 1, wherein said binocular ferrite core is fixed on the printed circuit board by bonding.

* * * * *

UNITED STATES PATENT AND TRADEMARK OFFICE
CERTIFICATE OF CORRECTION

PATENT NO.         : 8,634,784 B2
APPLICATION NO.    : 13/131018
DATED              : January 21, 2014
INVENTOR(S)        : Pierre Bertram It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 249 days.

Signed and Sealed this
Twenty-second Day of September, 2015

Michelle K. Lee
*Director of the United States Patent and Trademark Office*